US005567984A

United States Patent [19]
Zalesinski et al.

[11] Patent Number: 5,567,984
[45] Date of Patent: Oct. 22, 1996

[54] PROCESS FOR FABRICATING AN ELECTRONIC CIRCUIT PACKAGE

[75] Inventors: Jerzy M. Zalesinski, Essex Junction, Vt.; Alan J. Emerick, Warren Center, Pa.

[73] Assignee: International Business Machines Corporation, Armonk, N.Y.

[21] Appl. No.: 468,313

[22] Filed: Jun. 6, 1995

Related U.S. Application Data

[62] Division of Ser. No. 351,761, Dec. 8, 1994.

[51] Int. Cl.$^6$ .............................. H01L 23/48; H01L 23/04
[52] U.S. Cl. .................. 257/697; 257/698; 257/730
[58] Field of Search ................................ 257/693, 697, 257/698, 730

[56] References Cited

U.S. PATENT DOCUMENTS

| | | | |
|---|---|---|---|
| 3,684,817 | 8/1972 | Card, Jr. et al. | 174/52 R |
| 4,074,342 | 2/1978 | Honn et al. | 361/411 |
| 4,082,394 | 4/1978 | Gedney et al. | 339/17 M |
| 4,126,882 | 11/1978 | Carson et al. | 357/74 |
| 4,233,620 | 11/1980 | Darrow et al. | 357/74 |
| 4,618,739 | 10/1986 | Theobald | 174/52 |
| 4,868,638 | 9/1989 | Hirata et al. | 257/697 |
| 4,890,152 | 12/1989 | Hirata et al. | 357/72 |
| 4,970,577 | 11/1990 | Ogihara et al. | 357/74 |
| 4,985,597 | 1/1991 | Sekigachi et al. | 174/52.4 |
| 5,006,922 | 4/1991 | McShane et al. | 357/74 |
| 5,102,829 | 4/1992 | Cohn | 257/697 |
| 5,241,454 | 8/1993 | Ameen et al. | 361/744 |
| 5,261,157 | 11/1993 | Chang | 29/844 |
| 5,410,451 | 4/1995 | Hawthorne et al. | 361/760 |

FOREIGN PATENT DOCUMENTS

| | | | |
|---|---|---|---|
| 25 14 123 | 10/1975 | Germany. | |
| 59-163842 | 9/1984 | Japan. | |
| 63-98142 | 4/1988 | Japan. | |
| 63-174344 | 7/1988 | Japan. | |
| 1-39051 | 2/1989 | Japan. | |
| 64-39051 | 2/1989 | Japan. | |
| 1-93157 | 4/1989 | Japan. | |
| 3-35550 | 2/1991 | Japan. | |
| 4-6858 | 1/1992 | Japan. | |
| 4-25049 | 1/1992 | Japan | 257/697 |
| 4-168749 | 6/1992 | Japan | 257/697 |
| 4-186661 | 7/1992 | Japan | 257/697 |

OTHER PUBLICATIONS

Chapman et al., Microelectronic Packaging Technique, IBM Technical Disclosure Bulletin, vol. 6, No. 10 (1964), pp. 70–71.
Pin Attach/Chip Join Fixture, IBM Technical Disclosure Bulletin, vol. 37, No. 5 (1994), pp. 15–16.

*Primary Examiner*—Sara W. Crane
*Assistant Examiner*—S. V. Clark
*Attorney, Agent, or Firm*—Pollock, Vande Sande & Priddy

[57] ABSTRACT

An electronic circuit package is fabricated by providing a substrate having attached to at least one of its major surfaces, at least one integrated circuit chip; and providing a carrier that comprises a polymeric composition. The carrier holds a desired array of conductive pins, which protrude from both major surfaces of the carrier. The substrate is placed in contact with the pins to provide a subassembly.

12 Claims, 2 Drawing Sheets

PROCESS FOR FABRICATING AN ELECTRONIC CIRCUIT PACKAGE

This is a divisional application of Ser. No. 08/351,761, filed on Dec. 8, 1994 pending.

TECHNICAL FIELD

The present invention is concerned with a process for fabricating an electronic circuit package. In particular, the present invention provides a process for fabricating an electronic circuit package that mechanically protects the substrate from damage during the assembling process. The present invention is especially advantageous in protecting ceramic substrates during manufacturing and assembling processing. The present invention also makes it possible to manufacture pinned modules containing smaller pin spacing and smaller pin diameter that current technology permits.

BACKGROUND OF THE INVENTION

Ceramic pin grid array (PGA) type packages are used to a large extent for many very-large-scale integration (VLSI) devices. The pinned ceramic substrates are typically manufactured by attaching the electrically conductive pins, such as the copper or copper gold-coated pins to the ceramic by means of swaging or impact pinning. Both of these methods (swaging and impact pinning) form the pin heads and bulges that sandwich the ceramic substrate therebetween. However, the processing places undesirable stress on the ceramic substrate, which can cause cracking and/or breakage of the substrate. Typically, about 5% or more of the substrates are damaged and therefore must be discarded.

Stand-offs to provide free space between the integrated chips on the substrate and the subsequently to be provided cap are provided by swaging the corner pins sideways or reforming certain rows of pins.

In order to locate damaged substrates or out of specification parts from production, it is necessary to employ relatively expensive ultraviolet light inspections on the assembly line.

The present techniques are applied to a minimum pin spacing of 0.070 inches with a pin diameter of 0.016 inches minimum. The manufacturing of smaller pin grid spacing and smaller pin diameter needed to increase I/O pins over a given surface area has not been achieved in pinned ceramic products.

SUMMARY OF INVENTION

An objective of the present invention is to provide a fabrication process that significantly reduces, if not entirely eliminates, the problem of damaging the substrate during the pinning operation. It would also be desirable to provide a process that is sufficiently reliable to eliminate the relatively costly UV inspection procedure.

The present invention provides a fabrication process that eliminates the stress from the substrate during the pinning procedure. In addition, the process of the present invention protects the substrate during the manufacturing of the electronic package and subsequent connection to circuit boards. The present invention also makes it possible to create products with tighter pin spacing and smaller pin diameters than the prior art permits. Higher I/O pin count for a given required area allows desired miniaturization.

In particular, the present invention is concerned with a process for fabricating an electronic package. The process comprises providing a substrate having attached to at least one major surface thereof, at least one integrated circuit chip. In addition, a carrier is provided. The carrier comprises a thermosetting polymeric composition and is configured so that it holds a desired array of electrically conductive pins. The electrically conductive pins protrude from both major surfaces of the carrier.

A subassembly is fabricated by placing a major surface of the substrate in contact with the array of electrically conductive pins of the carrier. The pins are bonded to the substrate.

In addition, the present invention is concerned with an electronic circuit package obtained by the above-described process.

Furthermore, the present invention is concerned with the carrier employed in the process of the present invention. In particular, the carrier comprises a polymeric composition and is configured so that it holds a desired array of electrically conductive pins that protrude from both major surfaces of the carrier.

BEST AND VARIOUS MODES FOR CARRYING OUT INVENTION

Figure 1:
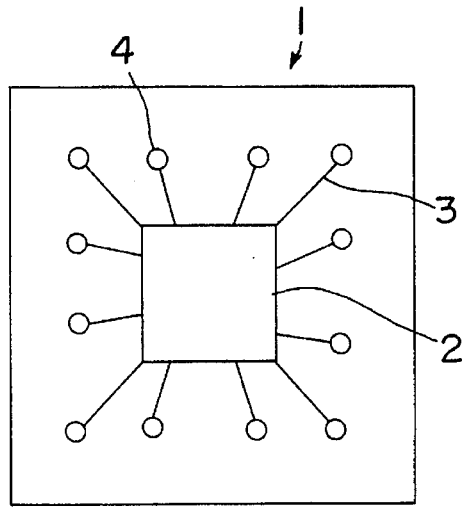
FIGS. 1 and 2 are views of a substrate having an integrated chip attached thereto.
Figure 2:
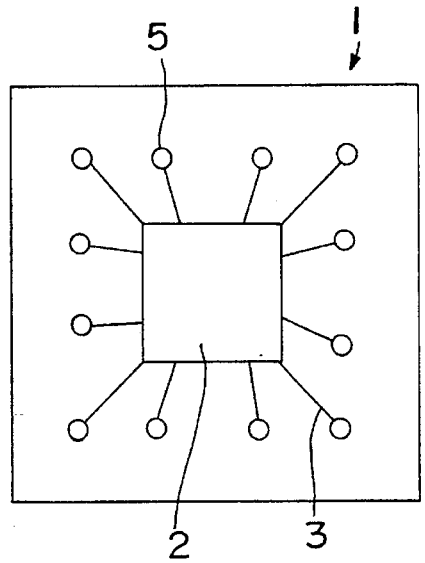

In order to facilitate an understanding of the present invention, reference is made to the figures. In particular, FIG. 1 illustrates a substrate 1 having an integrated circuit chip 2 attached thereto and connected via electrically conductive circuitry 3 to electrically conductive pad 4. FIG. 2 illustrates an alternative substrate-chip composite whereby the chip 2 is electrically connected to plated through holes 5 through electrical circuitry 3.

The substrate employed can be an organic, inorganic or composite in nature. The preferred substrate can be a ceramic module or a multi-layer printed circuit board. The preferred ceramic substrates include silicon oxides and silicates, such as aluminum silicate, and aluminum oxides.

The preferred multi-layer printed circuit boards include conventional FR-4 epoxy and laminates based on high temperature resin, such as high temperature epoxies, polyimides, cyanates (triazines), fluoropolymers, benzocyclobutenes, polyphenylenesulfides, polysulfones, polyetherimides, polyetherketones, polyphenylquinoxalines, polybenzoxazoles, and polyphenyl benzobisthiazoles.

Such polymeric substrates are usually molded articles of the resinous material, along with a reinforcing agent, such as being a glass-filled epoxy of phenolic based material. Examples of some phenolic-type materials include copolymers of phenol, resorcinol, and cresol. Typical epoxy resins include the bisphenol A type resins obtained from bisphenol A and epichlorohydrin, resinous materials obtained by the epoxidation of novolak resins produced from a phenolic material such as phenol and aldehyde, such as formaldehyde with epichlorohydrin.

The integrated circuit chip is attached to the substrate such as by employing an array of solder bumps. A typical solder bump is a 95 Pb/5 Sn alloy for attachment to ceramic substrate. Another method widely used to connect a chip to the substrate is wire-bonding. This method provides the connection between the chip and the substrate by application of discrete wires.

Figure 3:
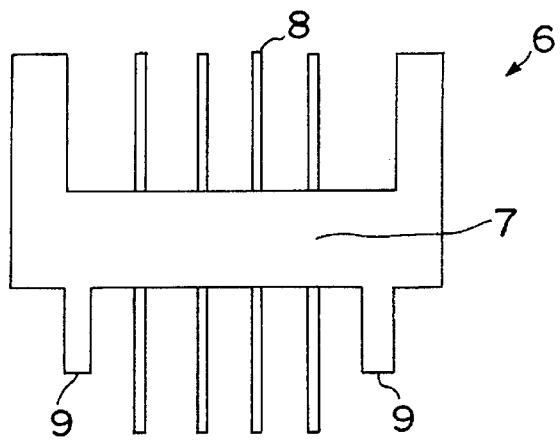
FIG. 3 is a schematic diagram of a carrier employed pursuant to the present invention.
Figure 6:
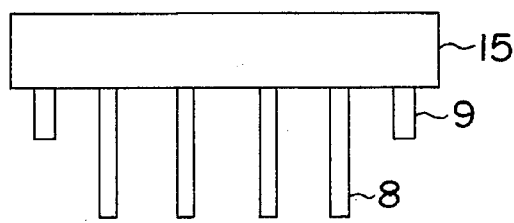
FIG. 6 is a cross-section of FIG. 5.

The carrier 6 (see FIG. 3) comprises a body portion 7 made from a composition containing a polymeric material that contains the desired array of electrically conductive pins 8 protruding from both surfaces of carrier 6. The carrier 6 can further, but not necessarily, include stand-off portion 9. The stand-offs designated as 9 provide spacing between the electronic circuit package and the circuit board to which such is subsequently attached to provide free space for cleaning. In addition, the carrier contains vertically extending wall means 11, which define the width of the carrier. Such wall means are provided for subsequent hermetic sealing of the integrated circuit chip and to facilitate positioning of the pins and the chip. In the preferred embodiment, the carrier 6 does not contain the stand-off portion 9.

The use of the carrier containing the pin array protects the substrate during the manufacturing process and eliminates any stress to the substrate during insertion of the completed module to a printed circuit board, by directing mechanical forces into the plastic carrier body instead of the substrate. In addition, the substrate pin arrangement makes it possible to use smaller diameter pins as well as increasing the pin array density. In fact, the present invention makes it possible to use a 0.050 inch or less pin grid that is quite problematic when employing existing impact and swage pinning processing.

The stand-offs 9, when present, are typically up to about 5 mils and more typically, about 2–3 mils high to provide free space between the finished electronic circuit package and any printed circuit board into which such is inserted to provide for cleaning such as water cleaning, when used. The carrier is usually about 1 to about 3 mils thick, and is sized so as to accommodate the substrate.

Depending upon the desired subsequent processing, either a low temperature or high temperature composition will be employed. For low temperature processing, compositions that flow and can be cured at temperatures of about 200° C. and below should be employed. For instance, laser may be used for performing local, (low temperature) solder reflow. In that event, any connection pads, pins and solder would be heated instead of heating the whole assembly. For high temperature processing, compositions that can withstand temperatures of about 350° C. should be employed. A typical high temperature composition usually contains a relatively high content of a non-conductive filler, including various oxides, such as glass filler, such as about 60 to about 80%. Typical polymers used for the high temperature processing are the ketone-based resins and especially the aromatic polyketones, including poly (aryl ether ether ketone) which can be represented by the formula:

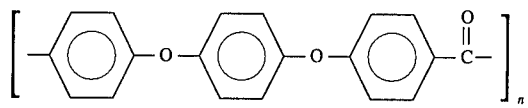

known as PEEK wherein n is an integer of a value to provide the desired melting point which is typically above 300° C. Another aromatic polyketone is poly (aryl ether ketone) which can be represented by the formula:

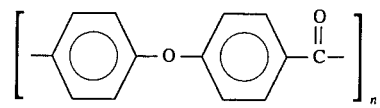

known as PEK wherein n has the same meaning as above. Also suitable are the polyetherketone ketones known as PEKK.

A particular polyetherketone is available from Corning Glass under the trade designation CORTEM.

Polymeric compositions suitable for low temperature processing include those polymers typically used for PGA, PLCC, JEDEC and SIMM applications, such as glass filled polyphenylene sulfide and liquid crystal polymers. The polymers employed for both the high temperatures and low temperature applications are preferably thermoplastic polymers. However, if desired, thermosetting polymers can be used.

Figure 4:
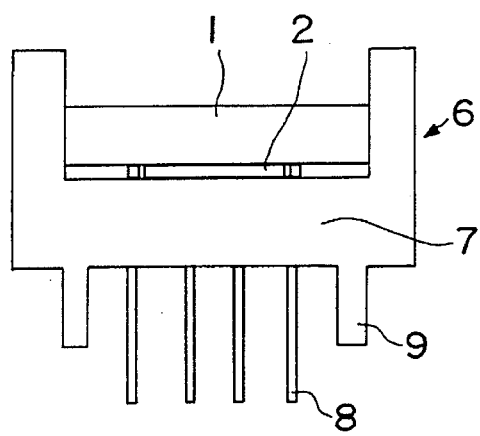
FIG. 4 represents a subassembly of the carrier and the substrate illustrated in FIG. 1.
Figure 5:
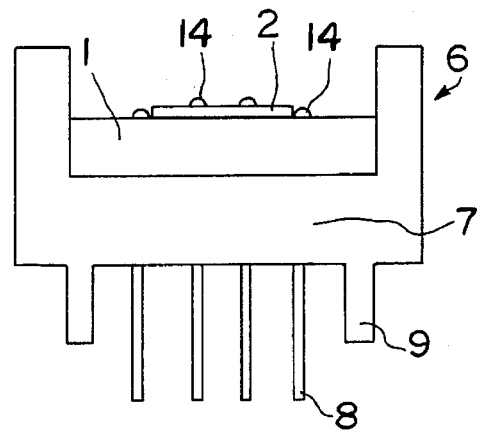
FIG. 5 is a schematic drawing of a subassembly of the carrier and substrate shown in FIG. 2.

A subassembly is fabricated by placing a major surface of the substrate in contact with the array of electrically conductive pins of the carrier (see FIGS. 4 and 5). FIG. 4 illustrates a substrate that contain pads to which the electrically Conductive pins are connected. For bonding the substrate to the pins, solder can be applied by a flux, preform method or more commonly by solder paste. As noted, the integrated circuit chip in this arrangement is located on the surface of the substrate that faces the carrier and in contact with the carrier.

FIG. 5 illustrates an alternative arrangement whereby the substrate has plated through holes and the pins 8 are inserted and extend out of the through holes 4. Solder paste 14 is placed on the top of the pin portion protruding out of the substrate. In this arrangement, the integrated circuit chip 2 is on that surface of the substrate that is remote from the carrier 6. When stand-offs are employed, typically, the carrier includes at least 4 stand-offs located within the vicinity of the parameter of the carrier.

Next, the subassembly is subjected to a reflow process at elevated temperatures in order to cause reflow of the solder to thereby bond the pins to the substrate. It is necessary that the composition of the carrier be capable of withstanding the temperatures employed in the reflow process.

Next, the integrated circuit chip is protected from the surrounding environment such as by placing a cap or can 15 over the substrate and integrated circuit chip in such a manner that pins protrude therefrom along with stand-offs 9. Typically, the cap or can is made of a metal such as aluminum. The cap or can is crimped thereby providing in connection with the carrier a seal to thereby hermetically seal the integrated circuit chip within the cap or can, in order to protect it from environmental conditions. In addition, if desired, the metal, such as the aluminum, can be in the form of a heat-sink.

In the alternative, the integrated circuit chip can be protected by encapsulating such within a conformal encapsulating coating as is well known in the art. Typical conformal encapsulating coatings are the epoxy compositions, such as HySol.

Figure 7:
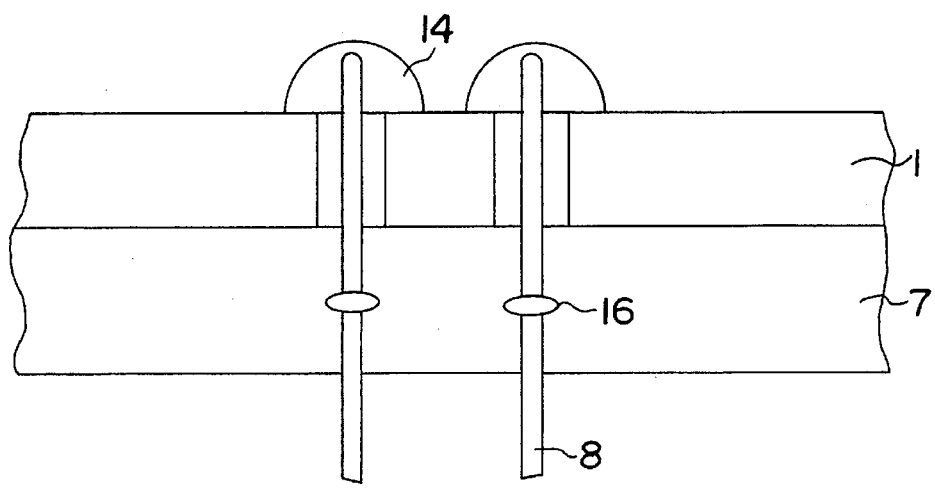
FIG. 7 is a schematic of the electronic circuit package prepared pursuant to the process of the present invention.

FIG. 7 illustrates an electronic circuit package prepared pursuant to the present invention wherein pins 8 have bumps 16, which aid in preventing pins 8 from freely moving within carrier 7.

What is claimed is:

1. A carrier which comprises a main body portion that contains stand-off portions and holds a desired array of electrically conductive pins protruding from major surfaces thereof; and being fabricated from a polymeric composition; and wherein electrically conductive pins of said array each contain a bump located on an intermediate portion of a pin held within said main body portion of said carrier.

2. The carrier of claim 1 wherein said array of pins has a pin to pin spacing of 0.070 inch or less.

3. The carrier of claim 1 wherein the height of said stand-offs is at least about 10 mils.

4. The carrier of claim 1 which further comprises at least 4 stand-offs located within the vicinity of the perimeter thereof.

5. The carrier of claim 1 wherein said pins contain solder thereon.

6. The carrier of claim 1 wherein said polymeric composition is thermoplastic.

7. The carrier of claim 1 wherein said array of electrically conductive pins comprises pins of a diameter of 0.020 inches or less.

8. The carrier of claim 2 wherein said array of electrically conductive pins comprises pins of a diameter of 0.020 inches or less.

9. The carrier of claim 1 which further comprises at least 4 stand-offs located within the vicinity of the perimeter thereof; the height of said stand-offs is at least about 10 mils; said array of electrically conductive pins comprises pins of a diameter of 0.020 inches or less, and the pin to pin spacing is 0.070 inches or less.

10. The carrier of claim 1 wherein the pin to pin spacing is 0.050 inches or less.

11. The carrier of claim 1 wherein the height of said standoffs is up to about 5 mils.

12. The carrier of claim 1 wherein the height of said standoffs is about 2–3 mils.

* * * * *